(12) United States Patent
En et al.

(10) Patent No.: US 6,380,588 B1
(45) Date of Patent: Apr. 30, 2002

(54) SEMICONDUCTOR DEVICE HAVING UNIFORM SPACERS

(75) Inventors: William G. En, Milpitas; Minh Van Ngo, Union City; Chih-Yuk Yang, San Jose; David K. Foote, San Jose; Scott A. Bell, San Jose; Olov B. Karlsson, San Jose; Christopher F. Lyons, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/567,013

(22) Filed: May 9, 2000

Related U.S. Application Data

(62) Division of application No. 08/993,830, filed on Dec. 18, 1997, now Pat. No. 6,103,611.

(51) Int. Cl.[7] ..................... H01L 21/00; H01L 21/3205
(52) U.S. Cl. ..................... 257/345; 257/327; 438/595
(58) Field of Search .................. 257/327, 345, 257/900; 438/709, 719, 695–696, 639, 595

(56) References Cited

U.S. PATENT DOCUMENTS

| 4,905,064 A | * | 2/1990 | Yabu et al. ................. 257/306 |
| 5,751,035 A | | 5/1998 | Kameda et al. ............. 257/300 |
| 5,770,498 A | | 6/1998 | Becker ........................ 438/239 |
| 5,899,722 A | | 5/1999 | Huang ......................... 365/226 |

FOREIGN PATENT DOCUMENTS

| JP | 60231357 A | * | 11/1985 |

\* cited by examiner

*Primary Examiner*—Minh Loan Tran
*Assistant Examiner*—Thomas L Dickey

(57) ABSTRACT

A semiconductor device having both functional and non-functional or dummy lines, regions and/or patterns to create a topology that causes the subsequently formed spacers to be more predictable and uniform in shape and size.

3 Claims, 3 Drawing Sheets

US 6,380,588 B1

SEMICONDUCTOR DEVICE HAVING UNIFORM SPACERS

This application is a divisional of application Ser. No. 08/993,830 filed Dec. 18, 1997, now U.S. Pat. No. 6,103,611.

TECHNICAL FIELD

The present invention relates to semiconductor devices and manufacturing processes, and more particularly to methods and arrangements for improved spacer formation within a semiconductor device.

BACKGROUND OF THE INVENTION

A continuing trend in semiconductor technology is to build integrated circuits with more and/or faster semiconductor devices. The drive toward this ultra large scale integration has resulted in continued shrinking of device and circuit dimensions and features. In integrated circuits having field-effect transistors, for example, one very important process step is the formation of the gate, source and drain regions for each of the transistors, and in particular the dimensions of the gate, source and drain regions. In many applications, the performance characteristics (e.g., switching speed) and size of the transistor are functions of the size (e.g., width) of the transistor's gate, and the placement of the source and drain regions there about. Thus, for example, a narrower gate tends to produce a higher performance transistor (e.g., faster) that is inherently smaller in size (e.g., narrower width).

As is often the case, however, as the devices shrink in size from one generation to the next, some of the existing fabrication techniques are not precise enough to be used in fabricating the next generation of integrated circuit devices. For example, spacers are used in conventional semiconductor devices to provide alignment of the source and drain regions to the gates in transistors. Minor differences in the shape of the spacers can alter the operational characteristics of the device. This is especially true for integrated circuits that have a plurality of similar devices that are meant to share common operating characteristics. Accordingly, there is a continuing need for more efficient and effective fabrication processes for forming semiconductor gates, spacers and regions that are more precisely controlled.

SUMMARY OF THE INVENTION

The present invention provides methods and arrangements that increase the process control during the formation of spacers within a semiconductor device. For example, in accordance with one aspect of the present invention, the spacers are provided on a semiconductor device gate arrangement and used to form lightly doped drain (LDD) regions within a semiconductor device arrangement. In accordance with other aspects of the present invention, the spacers are provided on a polysilicon line within the semiconductor device.

In accordance with one embodiment of the present invention, a method is provided for forming substantially uniformly sized spacers on transistor gate arrangements within a semiconductor device. The method includes forming a plurality of semiconductor device gate arrangements on a top surface of a substrate, such that two of the plurality of semiconductor device gate arrangements are positioned parallel to one another and separated by a defined space. The method includes forming the dielectric layer over at least a portion of each of the two semiconductor device gate arrangements and at least a portion of the defined space. Next, the method includes removing portions of the dielectric layer to form a plurality of spacers. Each of the spacers is physically connected to one of the semiconductor device gate arrangements and the substrate. Thus, because of the topology of the two semiconductor device arrangements, the spacers located within the defined space have a base width that is approximately the same. The method further includes configuring one of the two semiconductor device gate arrangements to control an electrical current between a source region and a drain region formed in the substrate and configuring the remaining one of the two semiconductor device gate arrangements to be non-operational. Thus, the non-operational transistor arrangement is provided for the purpose of controlling the topology and in particular the aspect ratio of the defined space between the operational and non-operational transistor gate arrangements.

In accordance with yet another embodiment of the present invention, a method is provided for controlling the width of a spacer in a semiconductor device arrangement. The method comprises forming an operational semiconductor device gate arrangement on a substrate at a first position, and a non-operational semiconductor device gate arrangement at a second position on a substrate. As such, the operational and non-operational semiconductor device gate arrangements are adjacent to each other but not touching and define a critical space between them. The method includes forming a dielectric layer over at least a portion of the operational and non-operational semiconductor device gate arrangements and within the critical space. The method further includes removing portions of the dielectric layer to form a first spacer that is physically connected to a sidewall of the operational semiconductor device gate arrangement in the substrate. The first spacer extends into the critical space. A second spacer is also formed and is physically connected to a sidewall of the non-operational transistor gate arrangement and the substrate. A second spacer extends into the critical space. As a result of this arrangement, each of the first and second spacers extends into the critical space for substantially the same distance.

In accordance with yet another embodiment of the present invention, a semiconductor device is provided that includes a substrate, a first semiconductor device gate arrangement, a second semiconductor device gate arrangement, a first dielectric spacer, and a second dielectric spacer. Within the substrate there is a source region and a drain region. The first semiconductor device gate arrangement has a first height and a first width and is formed on the substrate with the first width being centered over a first location on the substrate. The first semiconductor device gate arrangement is further configured to control an electrical current between the source region and the drain region formed in the substrate. The second semiconductor device gate arrangement has a second height and a second width and is formed on the substrate with the second width being centered over a second location on the substrate. The second location is separated from the first location by an initial space. The second semiconductor device gate arrangement is configured to be non-operational. The first dielectric spacer is physically connected to the substrate and a first sidewall of the first semiconductor device gate arrangement. The first sidewall of the first semiconductor device gate arrangement is of the first height and is located within the initial space. The first dielectric spacer has a first spacer width as measured at a base of the first dielectric spacer beginning at the first sidewall of the first transistor gate arrangement and extending into the initial space in a direction of the second location. The second dielectric spacer is physically connected to the substrate and a first sidewall of the second semiconductor device gate arrangement. The first sidewall of the second transistor gate arrangement has a second height and is located within the initial space. The second dielectric spacer has a second spacer width as measured at the base of the second dielectric spacer beginning at the first sidewall of the second semiconductor device gate arrangement and extending into the initial space in the direction of the first location. Thus, based on the arrangement of the first and second semiconductor device gate arrangements, and the resulting topology, the aspect ratio of the initial space causes the first spacer width and the second spacer width to be approximately the same.

In accordance with certain embodiments of the present invention, the first semiconductor device gate arrangement includes a thin oxide layer formed on the substrate and a gate conductor including polysilicon formed on the thin oxide layer.

In accordance with yet other embodiments of the present invention, the first dielectric spacer comprises silicon oxide, silicon nitride, silicon-oxynitride, and/or silicon oxime.

In accordance with yet another aspect of the present invention, a method is provided for controlling the formation of spacers on a plurality of polysilicon lines that are formed within a semiconductor device. The method includes forming a plurality of polysilicon lines on a top surface of a substrate. The method further includes forming at least one dummy polysilicon line on the substrate, such that the dummy polysilicon line is substantially parallel to at least a portion of one of the polysilicon lines and is separated from that portion of the polysilicon line by a defined space that defined an aspect ratio. The method further includes covering the polysilicon lines and the dummy polysilicon line along with the top surface of the substrate below the defined space with at least one dielectric layer. The method further includes removing portions of the dielectric layer to form a plurality of separate dielectric spacers and a plurality of separate dummy dielectric spacers. Each of the dielectric spacers is connected to a sidewall of one of the plurality of polysilicon lines and the substrate. Each of the separate dummy dielectric spacers is connected to one of the dummy polysilicon lines and the substrate. Thus, because of the aspect ratio, the width of the dielectric spacers on the sidewalls of the polysilicon lines is more precisely controlled.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EXEMPLARY EMBODIMENTS

The process steps and structures described below do not form a complete process flow for manufacturing integrated circuits and/or semiconductor devices. The present invention can be practiced in conjunction with integrated circuit fabrication techniques currently used in the art, and only so much of the commonly practice process steps are included as are necessary for understanding of the present invention. Figures representing cross-sections of the portion of an integrated circuit or semiconductor device during fabrication are not drawn to scale, but instead are drawn to illustrate the features of the present invention.

In accordance with certain embodiments of the present invention, methods and arrangements are provided for improved control over the processes that are used to form spacers within semiconductor device arrangements and/or along polysilicon lines. As part of the invention, it was recognized that the topology and, in particular, the aspect ratio (e.g. height:width) of the spacing between semiconductor device gate arrangements on the substrate plays a particularly critical role in the formation of the spacers. As the design rules shrink, uniformity of the spacers is critical in cases where the spacers are used to mark/control the formation of the lightly doped (LDD) regions. Thus, in accordance with the present invention, the width of the spacers is better controlled during their formation by intentionally including non-operational transistor gate arrangements and/or dummy polysilicon lines to provide a controlled spacing and aspect ratio between the semiconductor device gate arrangements/polysilicon lines.

Figure 1:
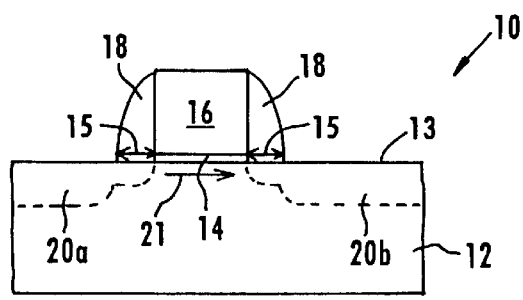
FIG. 1 depicts a cross-section of a portion of a prior-art semiconductor device having an operational transistor gate arrangement, spacers, and source and drain regions formed in a substrate.

FIG. 1 depicts a portion 10 of a cross-section of a prior-art semiconductor device having a substrate 12, a thin oxide layer 14, a gate conductor 16, spacers 18, source region 20a, and drain region 20b. Those skilled in the art will recognize that source region 20a and drain region 20b include lightly doped regions that extend under spacers 18. Thin oxide layer 14 is formed on the top surface 13 of substrate 12. Gate conductor 16 is formed on thin oxide layer 14. In accordance with certain embodiments of the present invention gate conductor 16 is a polysilicon line. Gate conductor 16 along with thin oxide layer 14 form an operational semiconductor device gate arrangement (such as a transistor gate arrangement) that can be used to control electrical current 21 as represented by the arrow shown between source region 20a and drain region 20b. The two spacers 18 preferably have equal widths 15 at their base as measured along top surface 13. Spacers 18 are typically used as a mask to form source region 20a and drain region 20b during a doping process, such as, for example, an ion implantation process.

Figure 2A:
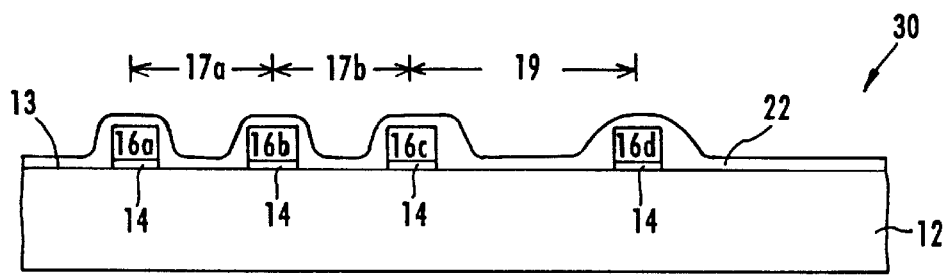
FIG. 2a depicts a cross-section of a portion of a prior-art semiconductor device having a plurality of operational transistor gate arrangements formed on a substrate and covered with a dielectric layer.
Figure 2B:
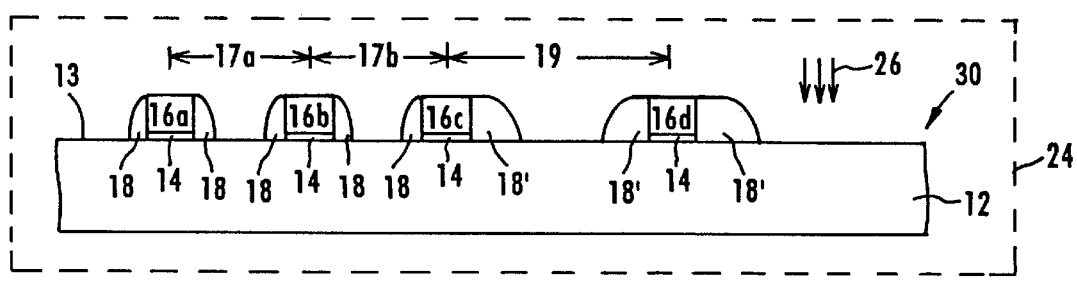
FIG. 2b depicts the portion of FIG. 2a following an anisotropic etch back process in an etching tool, which formed spacers having different widths.

A wider portion 30 of a similar prior-art semiconductor wafer is depicted in FIGS. 2a and 2b. As shown, a plurality of semiconductor device gate arrangements (such as transistor gate arrangements) have been formed on substrate 12, including gate conductors 16a, 16b, 16c, and 16d. The center points of gate conductors 16a and 16b are separated from each other by a first space 17a. Similarly, gate conductors 16b and 16c are separated by a first space 17b as measured from the center point of their respective widths. However, a second space 19, which is larger than first spaces 17a–b, extends between the center points of gate conductors 16c and 16d. As mentioned above, in this type of prior art semiconductor device, the topology plays a critical role in determining the width of the spacers 18 that are formed with dielectric layer 22. The dielectric layer 22 is a conformal dielectric layer or film that is deposited across the exposed surfaces of substrate 12 (on top surface 13) and over the exposed surfaces of gate conductors 16a–d, etc. Dielectric layer 22 typically includes silicon oxide and or silicon nitride. In accordance with conventional spacer formation techniques, portion 30 in FIG. 2a is depicted in FIG. 2b within an etching tool 24 following exposure to an anisotropic etching plasma 26. Etching plasma 26 removes portions of dielectric layer 22 leaving behind spacers 18 and 18'. As shown, spacers 18 and 18' each physically contact the sidewalls of gate conductors 16a–d (as applicable) and the top surface 13 of substrate 12. Spacers 18 and 18' further contact an oxide layer 14 within each of the semiconductor device gate arrangements formed with gate conductors 16a–d. As shown, the spacers 18' formed within second space 19 are differently shaped and have a wider width at their base than the spacers 18 formed, for example, in first spaces 17a and 17b. Spacers 18' are shaped differently because of the topology associated with space 19, which is more open than space 17a and 17b, for example. As a result, the source region 20a and drain region 20b (not shown in FIG. 2b) that would be formed using spacers 18' as a mask would tend to have different characteristics than those formed using the narrower spacers 18. Such differences can have a deleterious effect on the semiconductor device being fabricated.

Figure 3:
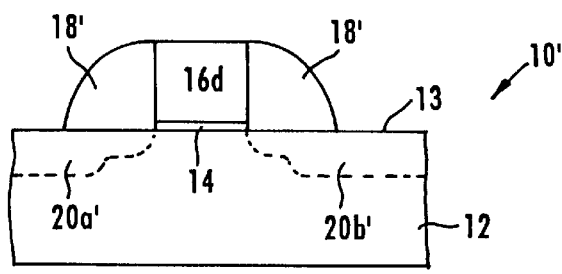
FIG. 3 depicts a cross-section of a part of the portion in FIG. 2b further illustrating that the non-uniform topology of the portion in FIG. 2b resulted in the formation of spacers of different sizes (widths and/or shapes)

By way of example, FIG. 3 depicts portion 10' of a semiconductor device similar to portion 10 in FIG. 1. However, portion 10' in FIG. 3 has wider spacers 18' and the source and drain regions 20a' and 20b' respectively, have slightly different shapes than those in FIG. 1. As a result, the semiconductor device arrangements in FIGS. 1 and 3 will tend to operate differently from each other. Thus, what is desired are improved methods and arrangements for providing increased process control during the formation of the spacers, and in particular, controlling the base width of the spacers to enhance uniformity within a plurality of similarly configured transistors and/or other like semiconductor devices.

Figure 4A:
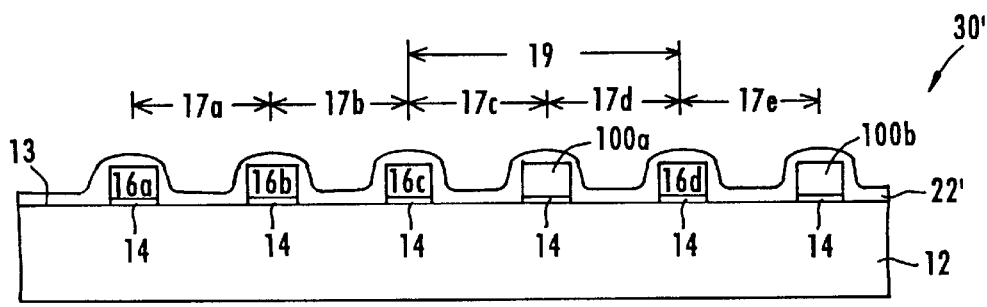
FIG. 4a depicts a cross-section of an improved portion of a semiconductor device, as compared to portion in FIG. 2b, having a non-operational transistor gate arrangement included amongst the plurality of operational transistor gate arrangements in accordance with certain embodiments of the present invention.

FIG. 4a shows an improved portion 30' in accordance with one embodiment of the present invention. Portion 30' in FIG. 4a is similar to portion 30 in FIG. 2a, with the exception of the addition of non-operational transistor gate arrangements as represented by gate conductors 100a and 100b. Gate conductor 100a has been added between gate conductors 16c and 16d to effectively divide second space 19 into two first spaces 17c and 17d, which are each substantially equivalent to first spaces 17a and 17b. Similarly, gate conductor 100b has been added next to gate conductor 16d leaving first spacer 17e therebetween. Both gate conductors 100a and 100b have been formed on a thin oxide layer 14 on substrate 12. The result of adding these additional non-operational transistor gate arrangements is that the topology of portion 30' has been altered to provide more uniformity in the spaces/aspect ratios between gate conductors.

Next, a dielectric layer 22' has been deposited over top surface 13 of substrate 12 and gate conductors 16a–d and 100a–b, etc. Dielectric layer 22' is applied, for example, using conventional chemical vapor deposition (CVD) or other like processes (e.g., plasma enhanced CVD), and in accordance with certain embodiments of the present invention, includes either silicon oxide, silicon nitride, or silicon-oxynitride.

Figure 4B:
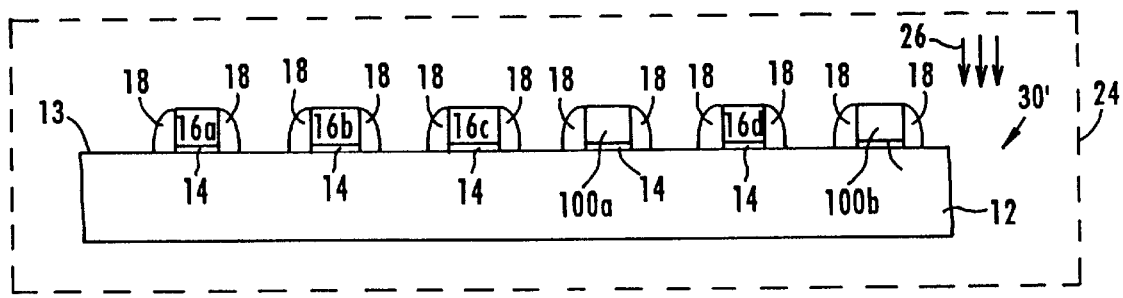
FIG. 4b depicts a cross-section of the portion in FIG. 4a following an anisotropic etching process which resulted in substantially uniformly sized spacers due to the more uniform topology, in accordance with certain embodiments of the present invention.

In FIG. 4b portion 30' has been subjected to an anisotropic etching plasma 26 within an etching tool 24. A plasma 26 is chosen that exhibits a high selectivity between dielectric layer 22' and the underlying structure, such as, for example, the top surface of substrate 12. As a result of the etching process, portions of dielectric layer 22' are etched away leaving behind spacers 18. As depicted, spacers 18 form along gate conductor 16a through 16b and on gate conductors 100a and 100b. For simplification of the drawings, the outermost spacers 18 on gate conductors 16a and 100b are shown as having approximately the same width as the other spacers 18, as would be the case if portion 30' were longer and had there been additional, similarly configured gate conductors. By adding non-operational gate conductors 100a and 100b to portion 30', the spacers 18 that are formed have substantially uniformly sized widths. Thus, the source and drain regions 20a and 20b (not shown in FIG. 4b) will be more uniformly shaped and sized.

Figure 5A:
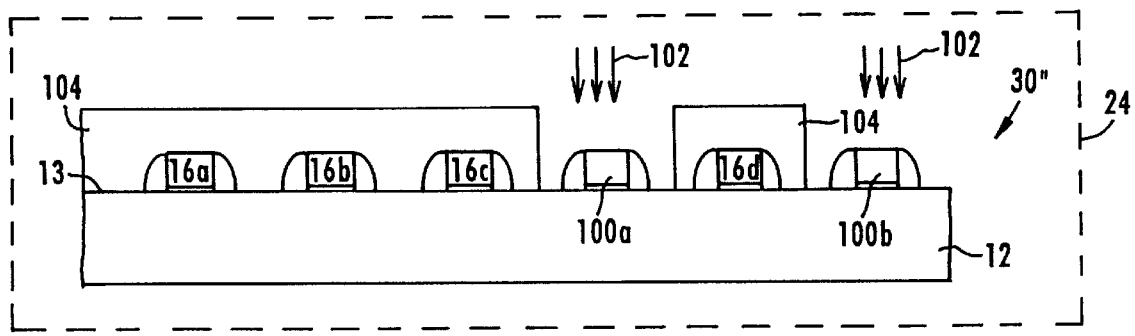
FIGS. 5a and 5b depict the cross-section of the portion in FIG. 4b during and following, respectively, removal of the non-operational semiconductor device gate arrangements, in accordance with certain embodiments of the present invention.
Figure 5B:
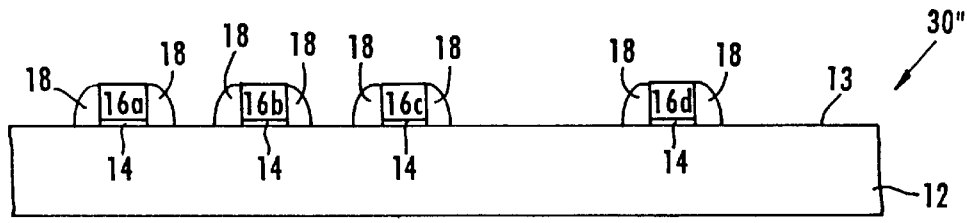

In FIG. 5a, portion 30' has been further processed to form portion 30", in which a patterned resist mask 104 has been added to allow for the removal of gate conductors 100a and 100b. This is accomplished by exposing portion 30" to an etching plasma 102 within etching tool 24, for example, to remove the exposed portions of gate conductors 100a and 100b, and spacers 18 attached thereto, and thin oxide layer 14 located below gate conductors 100a and 100b. The result of the etching process in FIG. 5a is depicted in FIG. 5b in which portion 30" has had the non-operational transistor gate arrangements, that were added prior to the formation of spacers 18, removed. The patterned mask 104 has also been removed. It is recognized, however, that in many cases it will not be necessary to remove the non-operational transistor gate arrangements 100a, 100b and/or dummy polysilicon lines from the semiconductor device. In these cases, portion 30' remains within the completed semiconductor device, and/or integrated circuit.

Figure 6A:
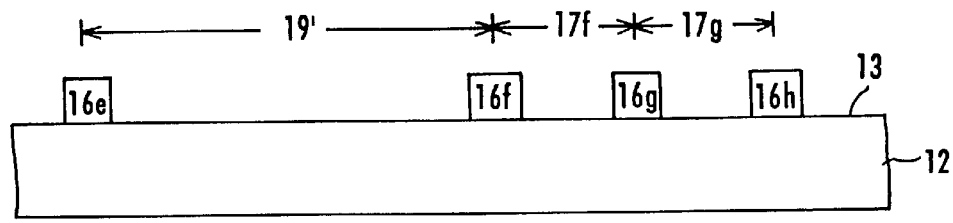
FIGS. 6a through 6c depict a portion of a cross-section of a semiconductor device having a plurality of polysilicon lines and/or operational semiconductor device gate arrangements formed on a substrate, to which has been added additional dummy polysilicon lines or non-operational semiconductor device gate arrangements, in accordance with certain embodiments of the present invention, to provide for the formation of substantially uniformly sized spacers.
Figure 6B:
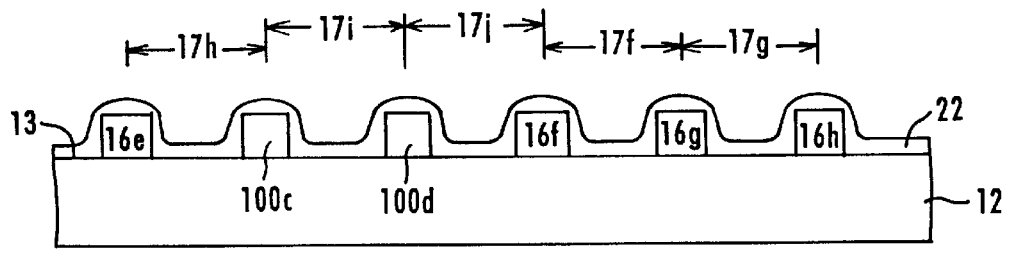
Figure 6C:
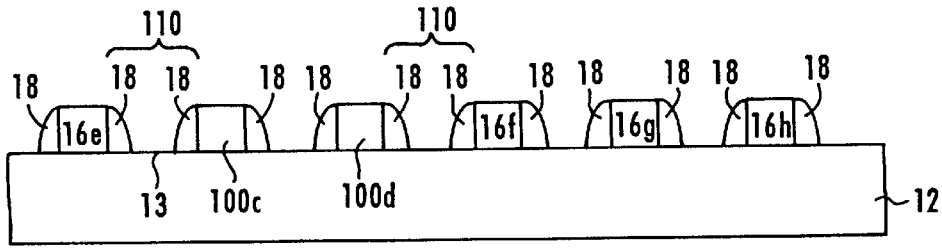

FIGS. 6a through 6c depict yet another section of portion 30' of a semiconductor device, in accordance with certain preferred embodiments of the present invention. In FIG. 6a, there is shown a second space 19' between polysilicon lines 16e and 16f. Applying the methods of the current invention, dummy polysilicon lines 100c and 100d have been added within second space 19' to provide more uniform topology and controlled aspect ratios during the formation of spacers when dielectric layer 22' is etched back. FIG. 6b depicts the location of dummy polysilicon lines 100c and 100d, as, for example, represented by their center points and the corresponding locations of top surface 13 and substrate 12. It is recognized of course that, as before, the present invention applies equally to transistor gate arrangements.

In FIG. 6c the portion 30' has been etched back, and spacers 18 have been formed along polysilicon lines 16e through h and along dummy polysilicon lines 100c and 100d. Given the spacing and controlled aspect ratios provided in FIG. 16b by the addition of dummy polysilicon lines 100c and 100d, spacers 18 in FIG. 6c have substantially uniform sizes, and in particular their base width is substantially equivalent.

Figure 7:
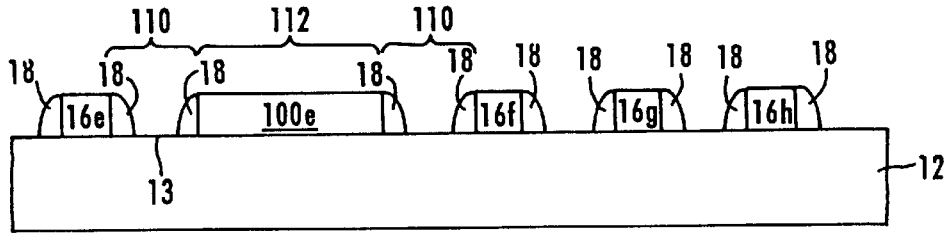
FIG. 7 depicts a cross-section of the portion in FIG. 6a following formation of a dummy polysilicon line or non-operational semiconductor device gate arrangement having a wider base, in accordance with certain embodiments of the present invention, that results in substantially uniformly sized spacers as in FIG. 6c.

In FIG. 7, another embodiment of the present invention is shown wherein a dummy polysilicon line 100e having a width 112, which is wider than the nominal widths of dummy polysilicon lines 100c and 100d in FIGS. 6a–c, has been formed between polysilicon line 16e and polysilicon line 16f. As depicted in FIG. 7 and in FIG. 6c, the spacing and controlled aspect ratios provided by adding dummy polysilicon lines 100c–d, allows spacers 18 to form with uniform widths. Thus, it is recognized that dummy polysilicon lines (and non-operational transistor gate arrangements) can be provided in a variety of widths and in some cases with different shapes, provided that the resulting aspect ratios are properly maintained to allow for the formation of spacers 18.

Figure 8:
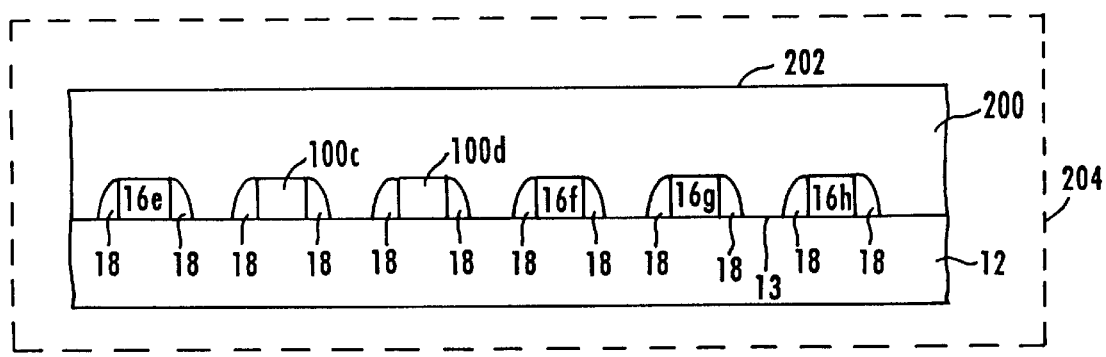
FIG. 8 depicts a cross-section of the portion of the semiconductor device in FIG. 6c following formation of a second dielectric layer that has a flat top surface, in accordance with certain embodiments of the present invention.

FIG. 8 depicts an additional benefit of the present invention in which the portion of FIG. 6c has had a second dielectric layer 200 formed thereon. For example, second dielectric layer 200 can include silicon oxide which is used during the formation of local interconnects using conventional damascene techniques. As depicted, second dielectric layer 200 has been subjected to a chemical-mechanical polishing (CMP) process using a CMP tool 204. Thus, second dielectric layer 200 has a planarized/polished top surface 202. By having the altered topology provided by dummy polysilicon lines 100c and 100d, the CMP process will be benefited due to the more uniform underlying topology presented during the formation/deposition of second dielectric layer 200 and as presented to the CMP slurry during the CMP process. Thus, the results of the CMP process are expected to improve for many semiconductor devices because of the more uniform underlying topology presented. Without the uniform topology, it is possible that the CMP process will create an uneven top surface.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor device arrangement comprising a semiconductor substrate having a mixture of operational gate arrangements and non-operational gate arrangements on a surface of the substrate, the space between said gate arrangements being substantially the same distance, each operational and non-operational gate arrangement having dielectric spacers which are of uniform shape and size, each spacer having substantially the same width and physically contacting the substrate, wherein removal of the non-operational gate arrangements provides operational gate arrangements on said substrate having uniformly sized spacers and different distances between the operational gate arrangements.

2. The semiconductor device of claim 1, wherein each operational gate arrangement and each non-operational gate arrangement comprises a thin oxide layer formed on the substrate and a polysilicon layer on the thin oxide layer.

3. The semiconductor device of claim 1, wherein the dielectric spacers comprise at least one dielectric material selected from the group consisting of silicon oxide, silicon nitride, silicon oxynitride and silicon oxime.

* * * * *